United States Patent
Silvennoinen et al.

(10) Patent No.: US 8,462,501 B2
(45) Date of Patent: Jun. 11, 2013

(54) POWER ELECTRONIC APPARATUS WITH COOLING ARRANGEMENT

(75) Inventors: Mika Artturi Silvennoinen, Espoo (FI); Mika Sares, Röykkä (FI)

(73) Assignee: ABB Oy, Helsinki (FI)

(*) Notice: Subject to any disclaimer, the term of this patent is extended or adjusted under 35 U.S.C. 154(b) by 181 days.

(21) Appl. No.: 12/972,621

(22) Filed: Dec. 20, 2010

(65) Prior Publication Data

US 2011/0149513 A1 Jun. 23, 2011

(30) Foreign Application Priority Data

Dec. 22, 2009 (EP) .................................... 09180407

(51) Int. Cl.
*H05K 7/20* (2006.01)
(52) U.S. Cl.
USPC .......................................... 361/695; 361/694
(58) Field of Classification Search
None
See application file for complete search history.

(56) References Cited

U.S. PATENT DOCUMENTS

| | | | |
|---|---|---|---|
| 4,648,007 A | 3/1987 | Garner | |
| 6,061,237 A | 5/2000 | Sands et al. | |
| 6,104,608 A | 8/2000 | Casinelli et al. | |
| 6,183,214 B1* | 2/2001 | Ko | 417/360 |
| 6,315,656 B1* | 11/2001 | Pawlowski | 454/184 |
| 6,406,257 B1* | 6/2002 | Houdek | 415/213.1 |
| 6,459,578 B1 | 10/2002 | Wagner | |
| 6,481,527 B1 | 11/2002 | French et al. | |
| 6,961,248 B2* | 11/2005 | Vincent et al. | 361/796 |
| 6,991,533 B2* | 1/2006 | Tsai et al. | 454/184 |
| 7,733,649 B2* | 6/2010 | Anderl et al. | 361/695 |
| 8,210,914 B2* | 7/2012 | McMahan et al. | 454/184 |
| 2002/0094772 A1 | 7/2002 | Gough | |
| 2003/0198018 A1* | 10/2003 | Cipolla et al. | 361/687 |
| 2003/0214785 A1* | 11/2003 | Perazzo | 361/695 |
| 2003/0224717 A1 | 12/2003 | Tsai et al. | |
| 2006/0158847 A1 | 7/2006 | Kauranen et al. | |
| 2007/0258219 A1 | 11/2007 | Howes et al. | |
| 2008/0212279 A1* | 9/2008 | Hirota et al. | 361/697 |
| 2008/0257639 A1 | 10/2008 | Yamaguchi et al. | |
| 2009/0284918 A1 | 11/2009 | Chou | |
| 2010/0014250 A1* | 1/2010 | Kitahara | 361/695 |
| 2012/0201003 A1* | 8/2012 | Shimasaki et al. | 361/695 |

FOREIGN PATENT DOCUMENTS

| | | |
|---|---|---|
| DE | 20114240 U1 | 2/2002 |
| EP | 1983814 A2 | 10/2008 |

OTHER PUBLICATIONS

European Search Report dated on Mar. 28, 2010, issued by the European Patent Office European Application No. 09180407.0.

* cited by examiner

*Primary Examiner* — Gregory Thompson
(74) *Attorney, Agent, or Firm* — Buchanan Ingersoll & Rooney PC (57) ABSTRACT

A power electronic apparatus with cooling arrangement comprises a housing (1) that accommodates the power electronic components (5). At least two adjacent axial fans (4) are connected to the housing (1) for inducing an airflow from outside into the housing (1) in order to cool the power electronic components (5). Furthermore, at least one pair of said adjacent fans (4) is disposed at an angle α with respect to each other in order to reduce noise caused by the fans. Such a cooling arrangement provides a power electronic apparatus with effective cooling in compact size and also having an acceptable level of noise.

17 Claims, 9 Drawing Sheets

POWER ELECTRONIC APPARATUS WITH COOLING ARRANGEMENT

TECHNICAL FIELD

The present invention relates power electronic apparatuses, in particular frequency converters, including cooling arrangements for cooling the power electronics.

In particular, the invention relates power electronic apparatuses the electrical power of which exceeds 10 kW and may reach even megawatts. Therefore, effective cooling is required in order to safeguard the proper functioning of the apparatus.

For many applications, the most convenient cooling method is cooling by airflow induced by a fan or fans. The fans and cooling arrangements are various also within the air-cooled power electronic apparatuses, and the requirements of a particular system are dictated by the application for which the apparatus is designed.

BACKGROUND ART

U.S. 2006/0158847 A1 discloses a cooling device for an electronic apparatus, such as a frequency converter. The cooling device comprises a single radial fan.

U.S. 2007/0258219 A1 discloses an air-cooled power electronics module provided with a suitable number of adjacent fans.

DISCLOSURE OF INVENTION

It is an object of the present invention to create a power electronic apparatus having a new cooling arrangement that allows relatively effective cooling in compact size and with an acceptable noise-level.

The object of the invention is achieved by a power electronic apparatus, such as a frequency converter comprising a housing that accommodates the power electronic components, and at least two adjacent axial fans connected to the housing for inducing airflow from outside into the housing in order to cool the power electronic components. Furthermore, at least one pair of said adjacent fans is disposed at an angle α with respect to each other in order to reduce noise caused by the fans.

The present invention brings forth a power electronic apparatus having a new cooling arrangement that allows relatively effective cooling in compact size and with an acceptable noise-level.

The compact size and effective airflow are achieved by means of axial flow fans that are connected to the housing of the power electronic apparatus. Such powerful fans are typically noisy, but the noise level is reduced by the afore-specified configuration of the apparatus without impairment of the airflow.

Such fans can also be often driven without a separate AC converter, which also contributes to the compact size of the apparatus.

The inventive concept allows also several useful and advantageous embodiments, which provide further advantages.

According to an embodiment, the angle α is between 6 and 50 degrees, such as between 10 and 20 degrees.

According to an embodiment, the fans are disposed such that the airflows leaving the pair of said adjacent fans are inclined towards each other.

According to an embodiment, the axes of rotation of the adjacent fans substantially meet each other at a distant point such that the angle α can be measured between the axes of rotation. This is the case wherein the axes of rotation extend along a common plane.

According to another embodiment, the axes of rotation of the adjacent fans do not meet each other but are tilted with respect to a common reference plane. Then, the axes of rotation have tilting angles β with respect to the reference plane, and the angle α can be measured between the projections of the axes of rotation on the reference plane.

According to an embodiment, the tilting angles β are less than 5 degrees.

According to an embodiment, further noise reduction is achieved by providing the apparatus with a separating wall that extends outside the housing from between the at least two adjacent axial fans.

According to an embodiment, each of the adjacent fans has an outer diameter d and the separating wall extends outside the housing in the direction opposite to the direction of the airflow for a length l such that the length l is between 50 and 100% of the outer diameter d, such as between 60 and 80% of the outer diameter d.

According to an embodiment, the separating wall has a height h in the direction perpendicular to the direction of the airflow such that the height h is between 50 and 300% of the outer diameter d, such as between 100 and 200% of the outer diameter d. A more limited range for the height h is between 120 and 170% of the outer diameter d, and a particularly good value for many applications is 150% or about 150% of the outer diameter d.

According to an embodiment, the separating wall is substantially parallel with the direction of the airflow.

According to an embodiment, the adjacent axial fans and the separating wall are all secured to a common face of the housing.

As is apparent from the above disclosure, the present invention can be applied in a great variety of applications requiring.

BRIEF DESCRIPTION OF DRAWINGS

For a more complete understanding of the present invention and the advantages thereof, the invention is now described with the aid of the examples and with reference to the following drawings, in which.

BEST MODE FOR CARRYING OUT THE INVENTION

Figure 1:
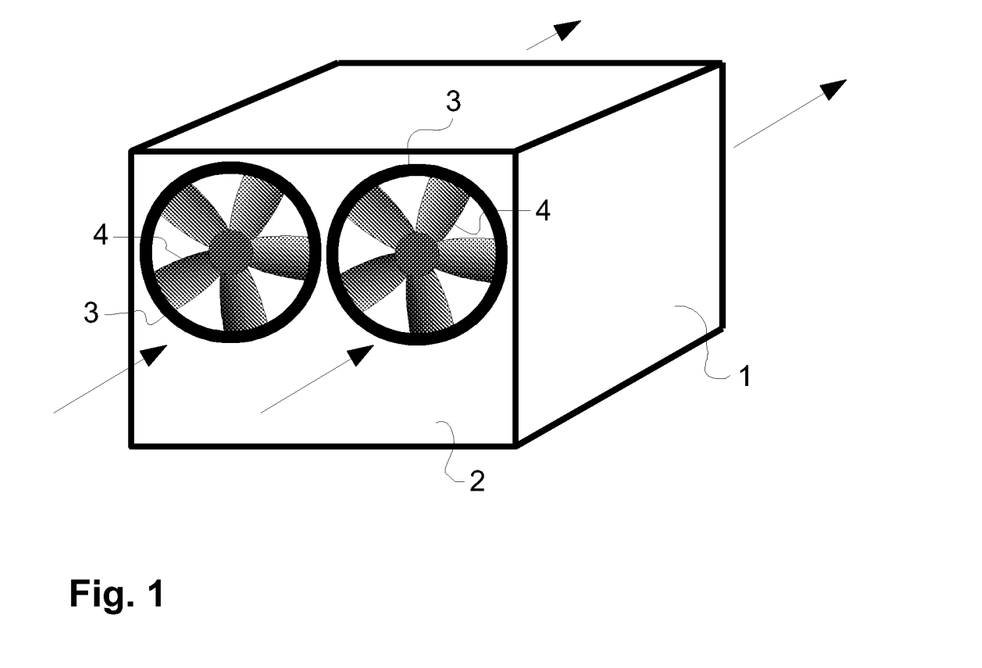
FIG. 1 presents a frequency converter according to an embodiment.

FIG. 1 presents a housing 1 of a frequency converter. The frequency converter comprises power electronic components (not shown) inside the housing 1 that dissipate heat and require cooling. The frequency converter of FIG. 1 is of the air-cooled type. Therefore, a front face 2 of the housing 1 defines two apertures acting as air inlets 3. FIG. 1 also shows two adjacent fans 4 fitted into the air inlets 3 for blowing cooling air inside the housing. The arrows in the Figure depict air movement induced by the fans 4 when they operate. In the embodiment of FIG. 1, the housing comprises air outlets at its back face, which is located at the opposite end of the housing with regard to the front face 2. The back face of the housing is however not visible in the Figure. It is also possible to locate the air outlets at other faces of the housing, if desired. For example, the air could be directed to circulate inside the housing and be lead outside the housing through air outlets at the front face 2 or the side panels of the housing.

Figure 2:
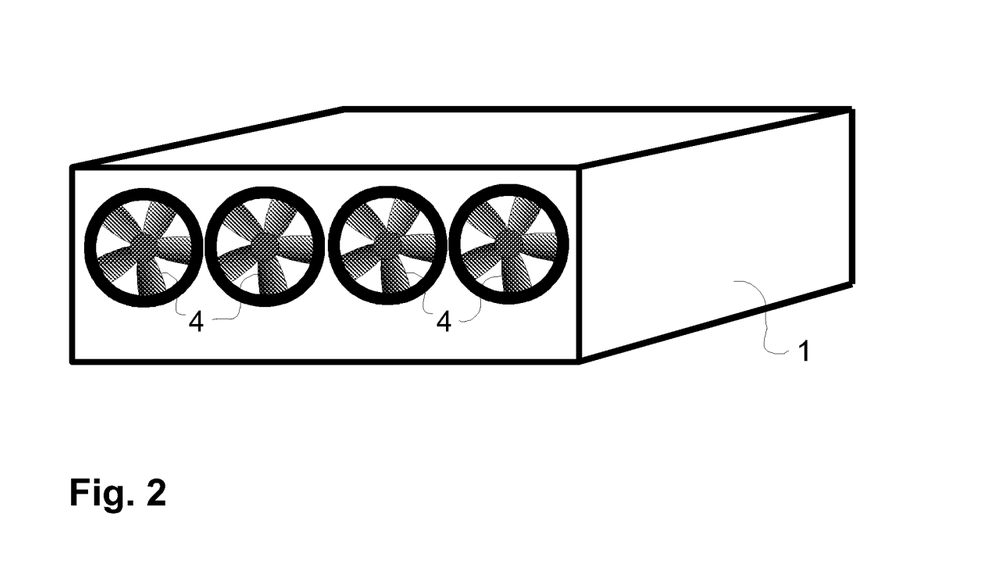
FIG. 2 presents a frequency converter according to another embodiment.

The number of fans is not limited but can be selected according to the requirements of each frequency converter application. FIG. 2 shows one such modification having four adjacent fans 4 mounted into the housing 1.

The power dissipation is considerable in the frequency converters according to the embodiments. The electrical power of the frequency converter can be between 10 kW and 5 MW, for instance. Then, the thermal power dissipated inside the housing 1 can be very considerable. In order to effectively cool the power electronic components by means of air-cooling, the frequency converter is provided with a sufficient number of air fans 4.

According to the embodiments, the fans 4 are of the axial flow type. An axial flow fan comprises a number of blades attached to a central hub, and in operation, the central hub is rotated around an axis of rotation, whereby the blades cause air to flow in a flow direction generally parallel with the axis of rotation in case the airflow is not deflected. In this document, the direction of a fan refers to the direction of such non-deflected general flow direction and, at the same time, also to the direction of the axis of rotation.

The fans 4 according to the embodiment are also in itself relatively powerful in order to achieve the necessary airflow through the housing 1. The power of each fan 4 can be between 10 W and 1 000 W, for instance. In apparatuses having higher power consumption, fans 4 with the input power of at least 50 W are typically used. Examples of such fans include Papst 6314/2TDHHP with the input power of 67 W and Japan Servo D1751S24B8ZP300 with the input power of 82 W. The level of noise can be in the range 65 to 85 dB when such fans operate.

In an embodiment, the electrical power of the frequency converter is selected from between 10 kW and 500 kW, and the input power of the fans 4 is between 60 W and 200 W.

FIG. 1 shows a compact arrangement of the frequency converter with the fans 4 and the air inlets 3 taking up a large portion of the area of the front face of the housing 1. This facilitates in achieving a high cooling airflow relative to the size of the housing 1. A drawback is that the two relatively high-power fans 4 create considerable noise.

Figure 3:
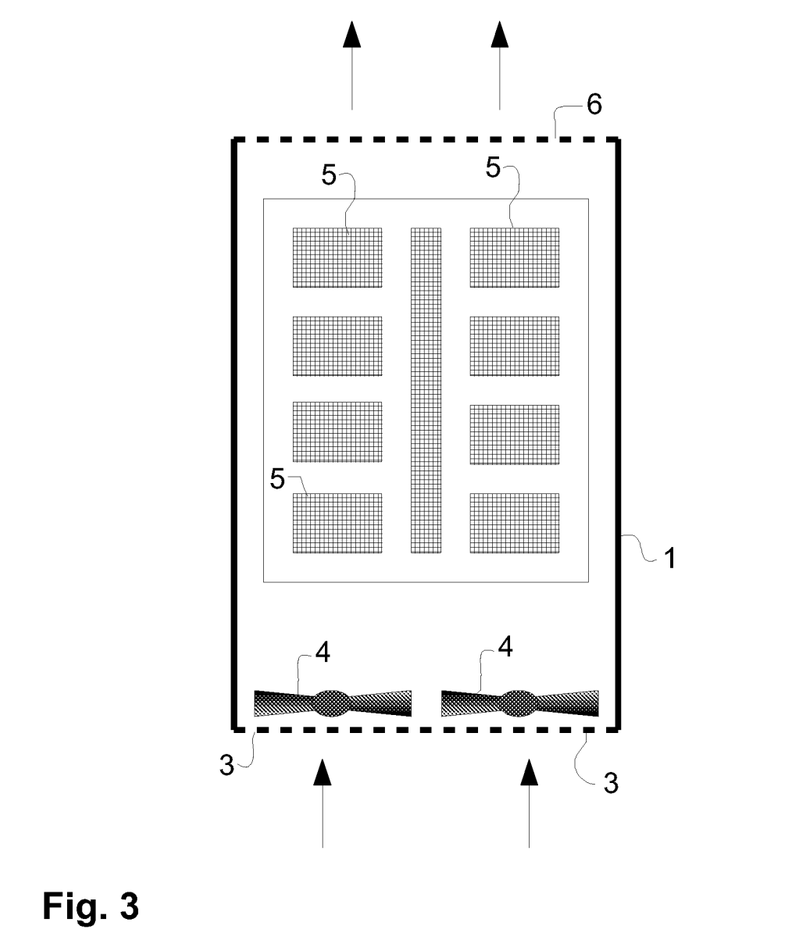
FIG. 3 presents a cross section of the frequency converter of FIG. 1 in one possible construction.

FIG. 3 presents a basic construction of a frequency converter according to FIG. 1 without the noise reduction modifications according to the embodiments of the invention. FIG. 3 is a schematic top view cross-section the frequency converter, showing the housing 1, power electronic components 5, air inlets 3, the two adjacent fans 4 and air outlet 6 at the back face of the housing 1.

In a first test set-up, the noise was measured when using one fan 4 at a time in the basic construction of the frequency converter as shown in FIG. 3. One of the fans was Papst 6314/2TDHHP with the power of 67 W and the other was Japan Servo D1751S24B8ZP300 with the power of 82 W. It was found that, when the fans were operated one at a time, the noise level measured at a reference point was 74.0 dB for the Papst 6314/2TDHHP fan and 70.3 dB for the Japan Servo D1751S24B8ZP300 fan. Thus, the basic construction of FIG. 3 should lead to noise levels of about 3 dB higher than the above values when operating both of the adjacent fans 4 at the same time.

Figure 4:
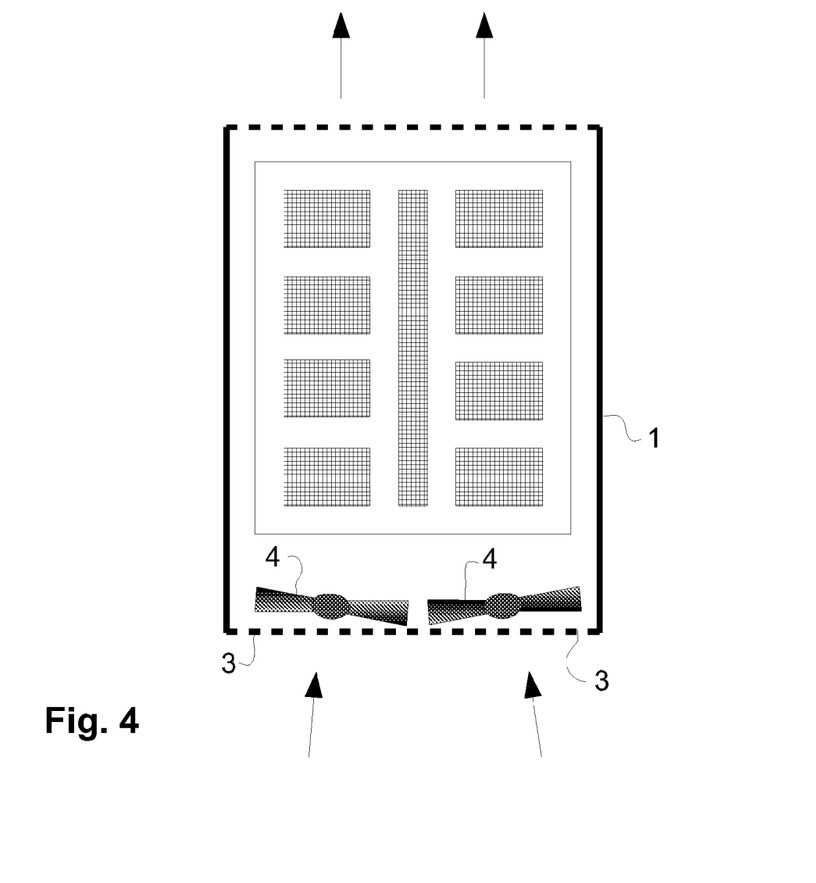
FIG. 4 presents a cross section of the frequency converter of FIG. 1 in a construction according to a first embodiment.

FIG. 4 presents a schematic top view cross-section of the frequency converter according to FIG. 1 including a noise reduction arrangement according to a first embodiment. In the first embodiment, the adjacent fans 4 are fitted in a tilted arrangement such that the general airflow directions are inclined towards each other.

Figure 5:
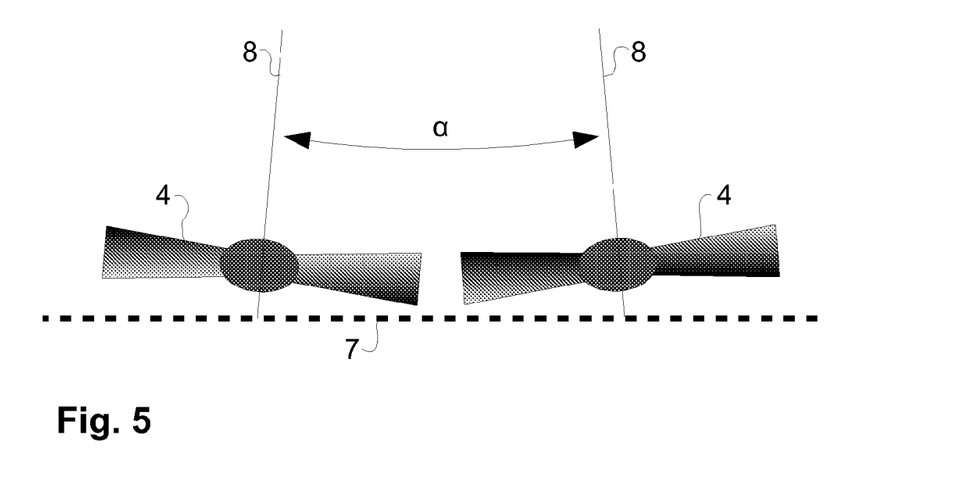
FIG. 5 is a schematic view of a structural detail in the frequency converter of FIG. 4.

FIG. 5 shows more closely the tilted arrangement of FIG. 4. FIG. 5 shows the fans 4 and a grating 7 covering the air inlets 3 shown in FIG. 4. FIG. 5 depicts also the axes 8 of rotation of the fans 8, and an angle $\alpha$ between the axes. Thus, the fans 4 are disposed at an angle $\alpha$ with respect to each other. In the embodiment of FIG. 5, both of the axes 8 of rotation extend along the plane of the cross-section depicted in the FIG. 5. The direction of the angle $\alpha$ is such that the axes 8 of rotation are inclined towards each other. Thus, in FIG. 5, the plane of the cross-section is applicable as the reference plane for defining the angle. However, there are also embodiments in which one or several of the fans 4 may be tilted also in the perpendicular direction and therefore there is need to define a more general reference plane for the angles.

In general, the reference plane for the angles goes via the central hubs of the fans and follows the general non-deflected flow direction of the air leaving the fans. Such a general flow direction of the air is of course somewhat imaginary in a practical apparatus set-up, as the housing 1 and other environment factors always guide the airflow at least to some extent. However, a skilled reader understands that the reference plane is needed in order to clearly define the angles and should not be ascribed other technical meaning.

As is apparent from the above discussion, the fans 4 can also be fitted such that the axes 8 of rotation extend at an angle with respect to the reference plane, such as the plane of the cross-section in FIG. 5. Then, the axis 8 of rotation defines an angle $\beta$ with respect to the reference plane. This angle $\beta$ is orthogonal to the angle $\alpha$ and can be individually set for each of the fans 4. Hence, in an embodiment having two fans 4, the first and second fans 4 have respectively first and second angles $\beta_1$ and $\beta_2$. In typical embodiments, the absolute values of the angles $\beta_1$ and $\beta_2$ are substantially equal but the angles are opposite in direction. The absolute values of the angles $\beta_1$ and $\beta_2$ can be less than 10 degrees, for instance. More typically, the absolute values of the angles $\beta_1$ and $\beta_2$ are less than 5 degrees. In case the absolute values of the angles $\beta_1$ and $\beta_2$ are less than 2 degrees, it can be considered that the embodiment substantially correspond to that of FIGS. 4 and 5.

In FIGS. 4 and 5, the angle $\alpha$ is 10 degrees. In general, the angle $\alpha$ can be between 6 and 50 degrees, for instance. In case the angle is less, it does not sufficiently aid in reducing the noise. On the other hand, greater angles are not beneficial in view of the airflow and lead also to inefficient use of space in the housing 1. When taking these aspects into account, it is expected that, for most of the applications, a good value for the angle α can be found in the range between 8 and 15 degrees.

The angle of about 10 degrees was found effective in reducing noise of the fans without impairment in the flow of cooling air also in measurements made with a second test set-up. The second test set-up corresponded otherwise to the first test set-up described above, except that there was an angle α of about 10 degrees between the axes 8 of the adjacent fans 4. The angles $\beta_1$ and $\beta_2$ were negligible, i.e. less than 2 degrees. The noise level of 65.8 dB was measured when operating two Japan Servo D1751S24B8ZP300 fans simultaneously. Thus, the noise level at the reference point was about 4.5 dB lower than when operating only one of the fans 4. If we take into account that the noise level should have been raised when using two identical fans 4 instead of one fan, we conclude that considerable reduction of noise was achieved by means of the angle α.

Figure 6A:
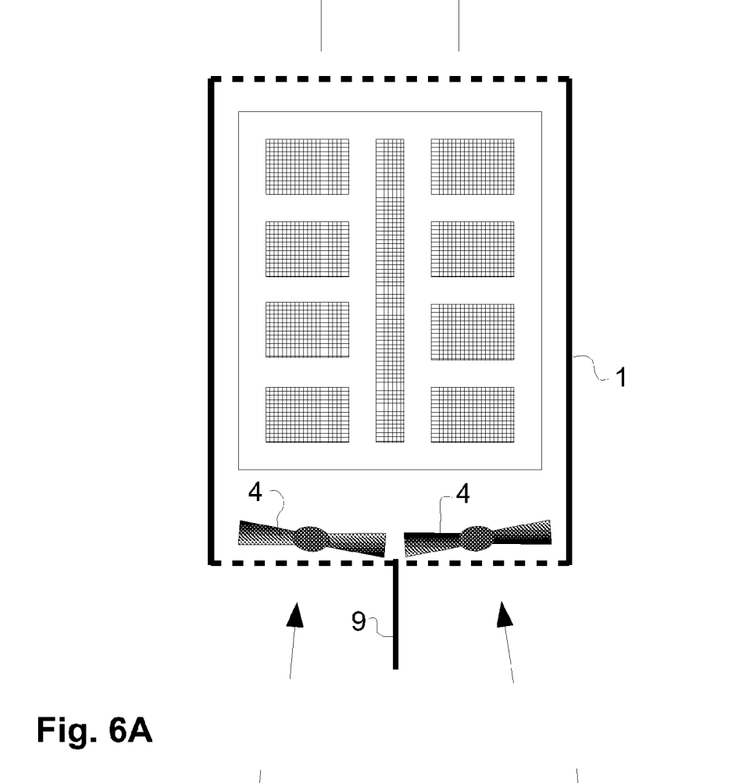
FIGS. 6A and 6B present cross sections of the frequency converter of FIG. 1 in two modifications of a construction according to a second embodiment.

FIG. 6A presents a schematic top view cross-section of the frequency converter according to FIG. 1 including a noise reduction arrangement according to a second embodiment. In the second embodiment, the adjacent fans 4 are fitted in a tilted arrangement such that the general airflow directions are inclined towards each other. In addition, a separating wall 9 is provided between the adjacent fans 4 in order to separate the airflows from the fans 4. In the modification presented in FIG. 6A, the fans 4 are fitted inside the housing 1.

Figure 6B:
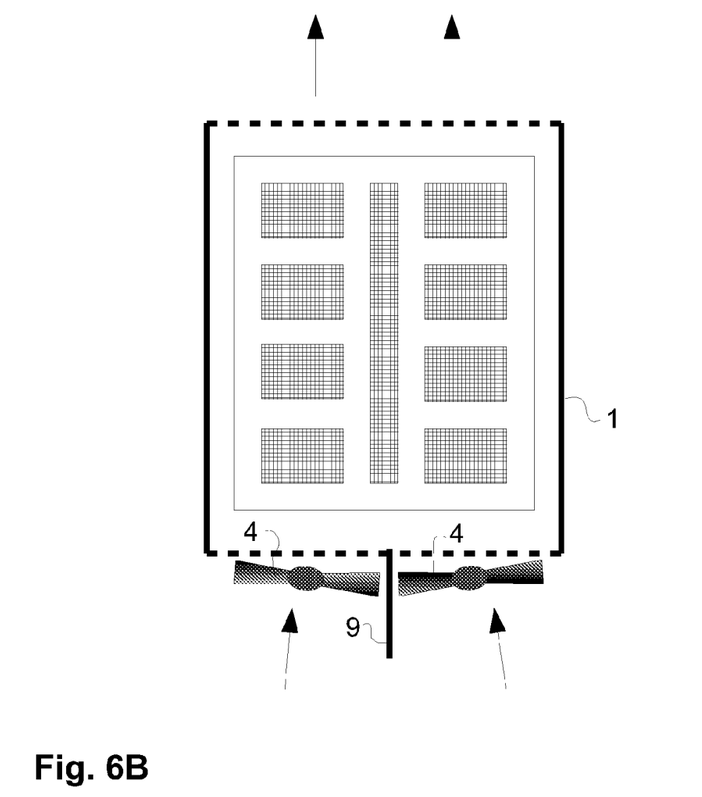

FIG. 6B presents a schematic top view cross-section of the frequency converter otherwise similar to that of FIG. 6A but having the fans 4 are fitted outside the housing 1. As can be seen in FIGS. 6A and 6B, this modification presented in 6B also allows the housing 1 to be manufactured shorter because no space for the fans 4 need be reserved inside the housing 1.

Figure 7A:
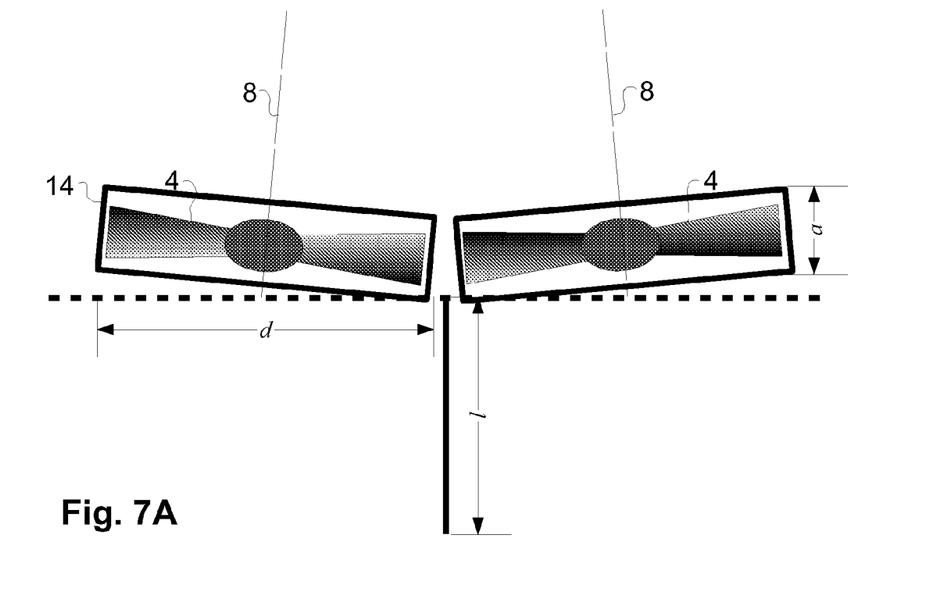
FIGS. 7A and 7B are schematic views of structural details in the frequency converters of FIGS. 6A and 6B.
Figure 7B:
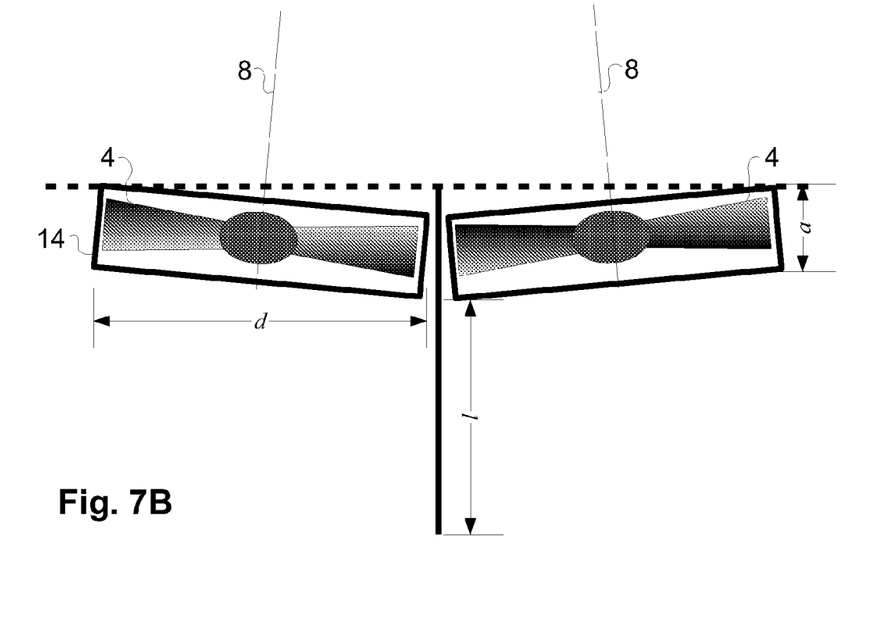

FIGS. 7A and 7B show more closely the tilted arrangement and the separating wall 9 of FIGS. 6A and 6B, respectively. With regard to the angles and inclinations, the second embodiment corresponds to the first embodiment already described above by reference to FIGS. 4 and 5. The additional feature in the second embodiment is the separating wall 9 secured between the two adjacent fans 4 outside the housing 1. FIGS. 7A and 7B also show fan housings 14 into which the actual fans 4 are fitted. Each fan housing 14 has a diameter d, hereinafter referred to also as the diameter of the fan 4, and a depth a, hereinafter referred to also as the depth of the fan 4.

The separating wall 9 extends a length l in a direction opposite to the flow direction of the air. The length l is 11 cm in the embodiments of FIGS. 6A and 6B. The length l is as measured from the level of the closest edges of the fans 4 or fan housings 14, if any. In case the length is too small, the separating wall 9 does not sufficiently aid in reducing the noise. On the other hand, too long a wall would take up too much space and would therefore be unacceptable when aiming at a compact structure with low noise. In the embodiments resembling those of FIGS. 6A and 6B, the length l could be selected between 8 and 16 cm, for instance, when the diameter of the fan 4 is between 16 and 18 cm. As already stated above, the diameter of the fan 4 refers to the outer diameter of the fan housing 14, which is about 17 cm for both of the fan types specified above. More generally, the length l of the separating wall 9 could be selected to be between 20 and 130% of the outer diameter of the fan housing 14. It is expected that, for most of the applications, a good value for the length l can be found in the range between 30 and 60% of the outer diameter of the fan housing 14. The outer diameter of the fan housing itself can be selected according to the needs of the application. Typical outer diameters may range between 15 and 40 cm, for instance.

An alternative way to define the length l of the separating wall 9 more generally is with reference to the depth a of the fan housing 14. Defined by this way, the length l of the separating wall 9 could be selected to be between 50 and 400% of the depth a of the fan housing 14. It is expected that, for most of the applications, a good value for the length l can be found in the range between 80 and 200% of the depth of the fan housing 14. Typical depths may range between 4 and 15 cm, for instance.

When designing the length of the separating wall 9, it should be noted that the actual component forming the wall is longer than the above-referred length l in the embodiment shown in FIGS. 6B and 7B. This is because the length l is measured from the edge of the fan housing 14 (as shown in FIG. 7B) and not from the front panel to which the separating wall 9 is secured in the embodiment of FIGS. 6B and 7B.

Another parameter of the separating wall 9 is its height h in the direction perpendicular to the length l. The height h can be selected, for example, between 50 and 300% of the outer diameter of the fan housing. It is expected that, for most of the applications, a good value for the height h can be found in the range between 100 and 200% of the outer diameter of the fan housing. A particularly good value for many applications is 150% or about 150% of the outer diameter d.

The separating wall 9 is made of a sufficiently rigid material, such as metal or hard plastic, and it is preferable unified in the sense that it does not contain holes allowing airflows to interfere with each other.

The use of a separating wall 9 between the adjacent fans was found to further reduce the noise level with regard to the apparatus set-up according to the second embodiment. This was found by measurements of a third test set-up that corresponded otherwise to the first test set-up described above, except that there was an angle α of about 10 degrees between the axes 8 of the adjacent fans 4 and a separating wall 9 with a length l of 11 cm between the fans 4. The angles $\beta_1$ and $\beta_2$ were negligible, i.e. less than 2 degrees. The noise level of 65.6 dB was measured when operating two Japan Servo D1751S24B8ZP300 fans simultaneously. When using two Papst 6314/2TDHHP fans simultaneously, the measured noise level was 68.4 dB at the same reference point. Thus, for the two simultaneously operating Papst fans, this embodiment gave about 5.6 dB noise reduction with regard to the measurements performed with only of such fans turned on.

Figure 8:
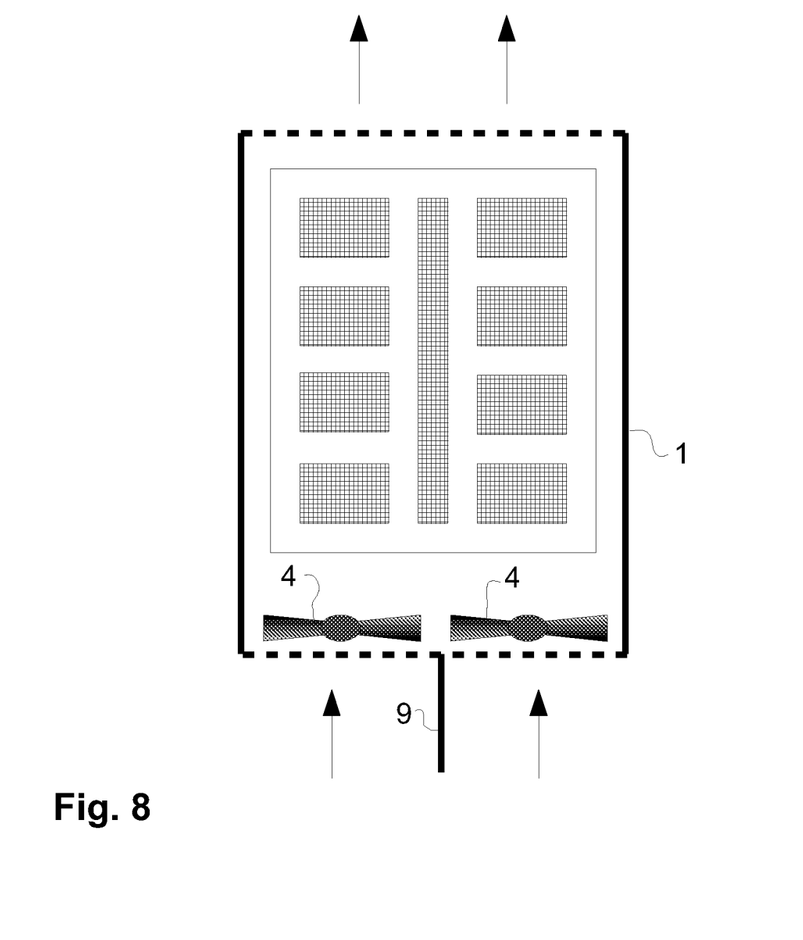
FIG. 8 presents a cross section of the frequency converter of FIG. 1 in a construction according to a third embodiment.

Therefore, it was shown that further noise reduction can be obtained by means of a separating wall. Even though the effect of the separating wall is not as great as the effect of the angle α, it is reasonable to provide the separating wall at least in such applications of the frequency converter wherein the noise level is critical and the housing 1 can readily accommodate the separating wall. The separating wall itself is not expensive and as it does not impair the cooling airflow, it is a reasonable and safe measure to use in such application. Thus, a further embodiment is also shown in FIG. 8, in which the basic construction of the frequency converter shown in FIG. 3 is provided with the separating wall as described above by reference to FIGS. 6 and 8.

The above-described embodiments can, of course, be modified in various ways.

For example, the number of fans 4 can be varied according to the needs of the applications. FIG. 2 shows a frequency converter having four fans. In such a configuration, it is possible to fit the fans as pairs, for example such that the two left-side fans are inclined towards each other as described above and the two right-side fans are also tilted accordingly. If desired, separating walls can be provided between each adjacent fan. The same procedure can be followed when there is an even number of fans and the configuration allows treating them as pairs. In case of odd number of fans or the fans being unpaired, it is possible that only some of the fans 4 are installed according to the above embodiments whereas the rest of the fans act alone without using the above means for reducing noise.

Figure 9:
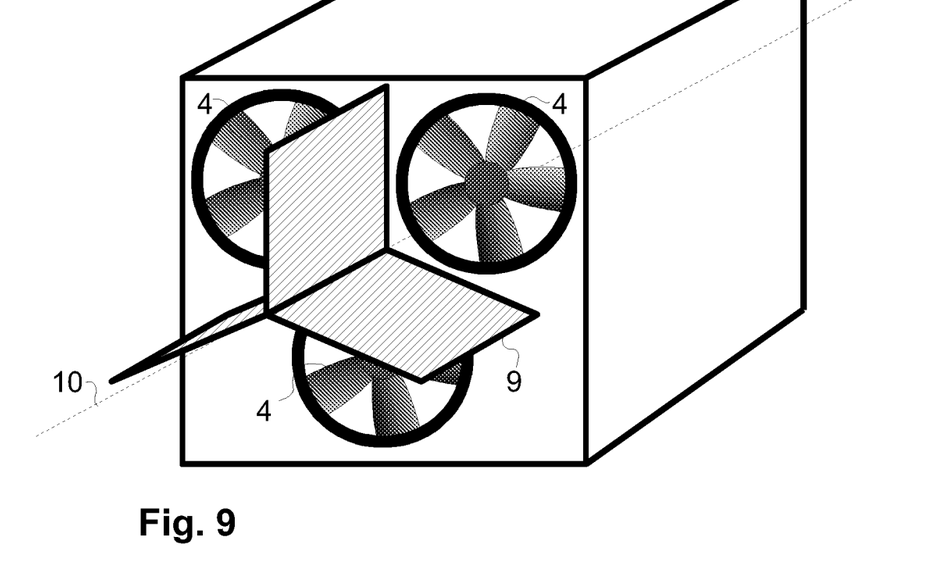
FIG. 9 presents an embodiment of the frequency converter with three fans.

It is also possible that for example three fans are all inclined towards each other in a triangular configuration. FIG. 9 is a schematic drawing of such a triangular configuration in which three fans 4 are all inclined towards a common imaginary centre axis 10 shown in dotted line. FIG. 9 also shows one possible construction of separating walls 9 to be used in such a configuration. The separating walls 9 are formed by three plates shown in the Figure.

Figure 10:
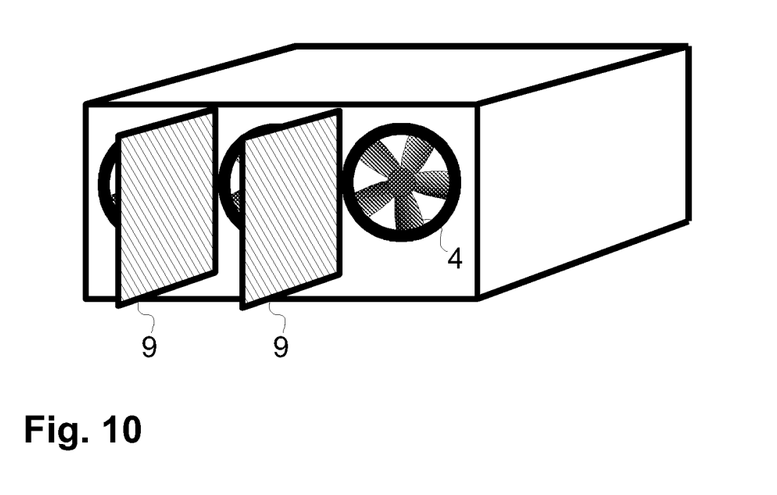
FIG. 10 presents another embodiment of the frequency converter with three fans.

FIG. 10 shows an embodiment, wherein three fans 4 are placed adjacently in a row. The three fans 4 can be place for example such that the left-side fan and the right-side fan are inclined towards the fan at the centre. An imaginary centre axis (not shown) coincides with the axis of rotation of the fans at the centre and the fans at the left and right sides are inclined towards the common imaginary centre axis. The angles of inclination and the other parameters can generally follow those described above in context with the other embodiments. It is also possible to provide separating walls 9 between the fans as is shown in the Figure.

Figure 11:
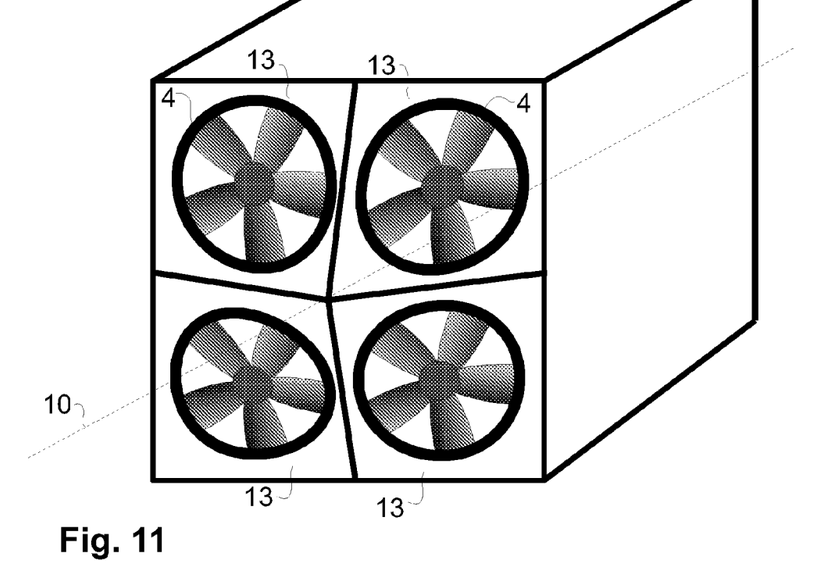
FIG. 11 presents an embodiment of the frequency converter with four fans.

FIG. 11 depicts an embodiment wherein the front panel has been divided into four curved front plates 13 to which a corresponding number of fans 4 have been fitted. All four fans 4 can be inclined towards a common imaginary centre axis 10 shown in dotted line.

Figure 12:
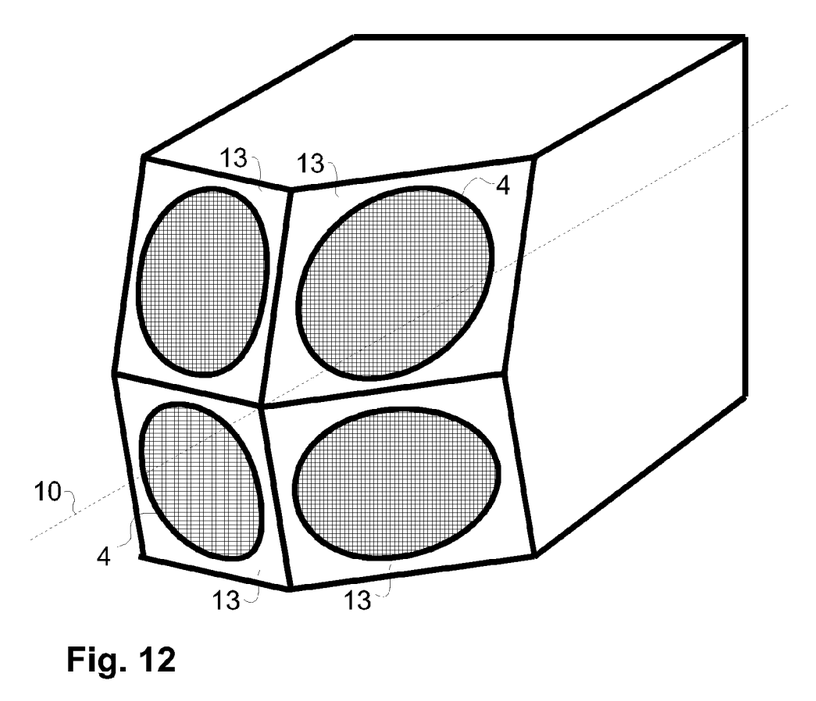
FIG. 12 presents another embodiment of the frequency converter with four fans.

FIG. 12 depicts an embodiment wherein the front panel has been divided into four straight front plates 13 fitted in angular relationship with each other. As shown in FIG. 12, there is a fan 4 secured to each of the four front plates 13. In this embodiment, the fan housings 14 can be secured to the front plates 13 without an angle between the fan housing 14 and the front plate 13, and it is still possible to achieve the angular relationship between the fans 4 by means of the angles between the front plates 13. Also in this embodiment, it is possible, even though in no means obligatory, to incline the all four fans 4 towards a common imaginary centre axis 10.

Figure 13:
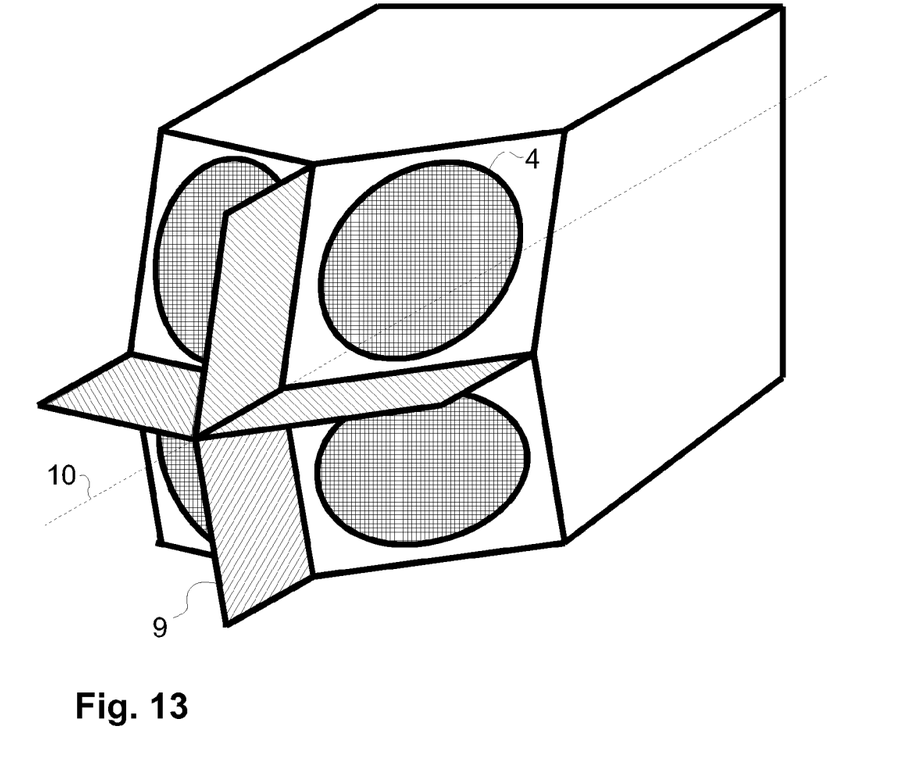
FIG. 13 presents a further embodiment of the frequency converter with four fans.

FIG. 13 depicts an embodiment otherwise identical to the embodiment of FIG. 12 but provided with separating walls 9 in front of the apparatus.

Figure 14:
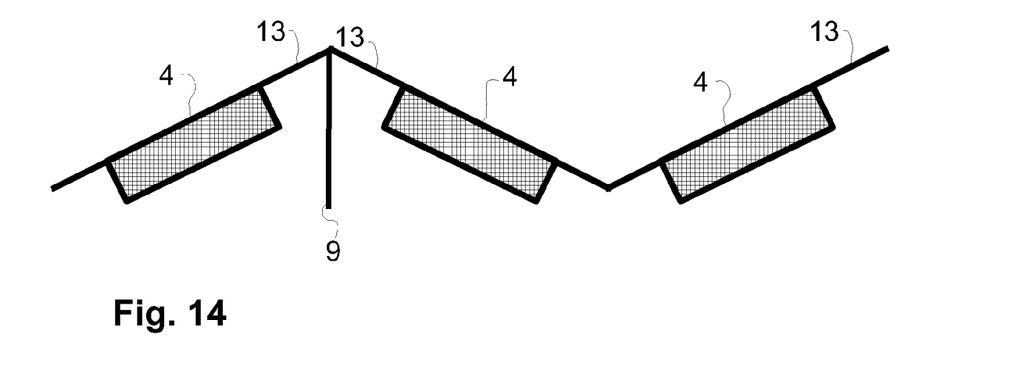
FIG. 14 presents a further embodiment of the frequency converter with three fans.

FIG. 14 depicts an embodiment wherein the front panel has been divided into three straight front plates 13 in succession. The fans 4 are secured to the outer surfaces of the front plates 13 and there is no angle between the fan 4 and the associated front plate 13. The embodiment has a separating wall 9 between first and second fans 4 (counting from the left side of FIG. 14) and an angle α (as described above) between the second and third fans 4 (again counting from the left side of FIG. 14). Thus, the noise is reduced by the angle α between the second and third fans 4 and by the separating wall 9 between the first and second fans 4. As can be seen in FIG. 14, the first and second fans 4 are disposed at an angle that is opposite in direction that the angle α used in noise reduction and therefore the separating wall 9 is provided between these fans. However, there is no separating wall 9 between the second and third fans 4 because the noise is reduced by means of the angle α and any further reduction by the separating wall 9 is not necessary. Furthermore, a separating wall 9 between the second and third fans 4 would extend outwardly from the front face of the apparatus and therefore increase the outer dimensions of the apparatus.

Also in the embodiments of FIGS. 11 to 14, the angles of inclination and the other parameters can generally follow those described above in context with the other embodiments.

As can be seen in FIGS. 11 to 13, the apparatus can comprise four fans placed in two adjacent rows such that each of the fans 4 forms a pair with two fans 4, one of which is in the same row and another in the adjacent row. Furthermore, each of such pairs can have the fans 4 disposed at the angle α with respect to each other, in which the angle α is as specified above in context with other embodiments. Such an apparatus may of course comprise, for example, six or eight fans disposed in a same fashion.

FIG. 13 also shows that the apparatus comprising four fans placed in two adjacent rows as described above also has a separating wall for each of said pairs of the fans.

As can be seen in FIGS. 11 to 14, the housing 1 of the apparatus can comprise a front face 2 that has at least two adjacent front plates 13. Furthermore, each of the at least two adjacent front plates 13 has at least one fan 4 secured thereto, and the front plates 13 are disposed at the angle with respect to each other. Again, the angle α is as specified above in context with other embodiments.

FIGS. 13 and 14 also show that the apparatus comprising the front face 2 with at least two adjacent front plates 13 as described above also has a separating wall 9 secured between said at least two adjacent front plates 13.

The minimum distance between the adjacent fans 4 is typically between 20% and 100% of the diameter d of the fan 4. Generally, the minimum distance between the adjacent fans 4 can be designed to be less than 200% of the diameter d. In case the adjacent fans have different diameters, the minimum distance can be calculated on the basis of diameter of the fan 4 having the smaller diameter.

The above description is only to exemplify the invention and is not intended to limit the scope of protection offered by the claims. The claims are also intended to cover the equivalents thereof and not to be construed literally.

The invention claimed is:

1. A power electronic apparatus, comprising:
a housing;
at least one power electronic component inside the housing; and
at least first and second adjacent axial fans connected to the housing for inducing an airflow from outside into the housing and for cooling the at least one power electronic component, wherein the first fan is disposed at an angle α of between 6 and 20 degrees with respect to the second axial fan for reducing noise;
wherein the angle α is such that an airflow leaving the first axial fan is inclined towards an airflow leaving the second axial fan and wherein the first axial fan and the second axial fan each have an axis of rotation and the angle α is measured between the axes of rotation.

2. The power electronic apparatus of claim 1, wherein the angle α is between 10 and 20 degrees.

3. The power electronic apparatus of claim 1, wherein each axis of rotation has a projection on a reference plane, each reference plane extending respectively in a direction of airflow and going through respective center points of the axial fans, and the axes of rotation defining angles β with respect to the reference plane, and wherein the angle α is measured between said projections of the axes of rotation on said reference plane.

4. The power electronic apparatus of claim 3, wherein the angles β are less than 5 degrees.

5. The power electronic apparatus of claim 1, wherein power of the power electronic apparatus is at least 10 kilowatts.

6. The power electronic apparatus of claim 1, wherein a power of each of the axial fans is at least 50 watts.

7. The power electronic apparatus of claim 1, comprising:
a separating wall extending outside the housing in a direction opposite to a direction of the airflow from between the first and second axial fans.

8. The power electronic apparatus of claim 7, wherein each of the axial fans has an outer diameter d and the separating wall extends outside the housing in a direction opposite to the airflow for a length/such that the length/is between 50 and 100% of the outer diameter d.

9. The power electronic apparatus of claim 7, wherein the separating wall has a height h in a direction perpendicular to the direction of the airflow such that the height h is between 50 and 300% of the outer diameter d.

10. The power electronic apparatus of claim 7, wherein the separating wall is substantially parallel with the direction of the airflow.

11. The power electronic apparatus of claim 7, wherein each of the axial fans and the separating wall are secured to a common face of the housing.

12. The power electronic apparatus of claim 1, comprising:
a third axial fan and a fourth axial fan placed in two adjacent rows such that each axial fan has a fan in a same row and another fan in an adjacent row, that forms a pair with the said fan, and each of the pairs having fans disposed at the angle α with respect to each other.

13. The power electronic apparatus of claim 1, wherein the housing comprises:
a front face having at least two adjacent front plates, each of the at least two adjacent front plates having at least one axial fan secured thereto, and the at least two adjacent front plates being disposed at the angle α with respect to each other.

14. A frequency converter, comprising:
a housing;
at least one power electronic component inside the housing; and
at least first and second adjacent axial fans connected to the housing for inducing an airflow from outside into the housing and for cooling the at least one power electronic component, each of the adjacent fans having an axis of rotation;
wherein the first axial fan is disposed at an angle α of between 6 and 50 degrees with respect to the second axial fan for reducing noise, wherein the angle α is measured between the axes of rotation of the fans, and the angle α is such that an airflow leaving the first axial fan is inclined towards an airflow leaving the second axial fan, and
the first axial fan and the second axial fan each have an axis of rotation and the angle α is measured between the axes of rotation.

15. The frequency converter of claim 14, wherein the angle α is between 6 and 20 degrees.

16. The frequency converter of claim 14, comprising:
a third axial fan and a fourth axial fan placed in two adjacent rows such that each axial fan has a fan in a same row and another fan in an adjacent row, that forms a pair with said fan, each of the pairs having the fans disposed at the angle α with respect to each other.

17. The frequency converter of claim 14, wherein the housing comprises:
a front face having first and second adjacent front plates, each front plate having at least one fan secured thereto, and the first front plate being disposed at the angle α with respect to the second front plate.

* * * * *